(12) United States Patent
Zhu

(10) Patent No.: US 11,063,136 B2
(45) Date of Patent: Jul. 13, 2021

(54) SEMICONDUCTOR DEVICE STRUCTURES WITH COMPOSITE SPACERS AND FABRICATION METHODS THEREOF

(71) Applicant: Changxin Memory Technologies, Inc., Anhui (CN)

(72) Inventor: Rongfu Zhu, Hefei (CN)

(73) Assignee: Changxin Memory Technologies, Inc., Anhui (CN)

( * ) Notice: Subject to any disclaimer, the term of this patent is extended or adjusted under 35 U.S.C. 154(b) by 0 days.

(21) Appl. No.: 16/730,821

(22) Filed: Dec. 30, 2019

(65) Prior Publication Data

US 2020/0135888 A1 Apr. 30, 2020

Related U.S. Application Data

(63) Continuation of application No. PCT/CN2018/093905, filed on Jun. 30, 2018.

(51) Int. Cl.
*H01L 29/66* (2006.01)
*H01L 21/28* (2006.01)
(Continued)

(52) U.S. Cl.
CPC .... *H01L 29/6656* (2013.01); *H01L 21/28123* (2013.01); *H01L 29/41775* (2013.01); *H01L 29/4983* (2013.01); *H01L 29/66515* (2013.01)

(58) Field of Classification Search
CPC ....... H01L 21/76897; H01L 21/823468; H01L 21/823475; H01L 21/843864;
(Continued)

(56) References Cited

U.S. PATENT DOCUMENTS 6,225,176 B1 5/2001 Yu
7,189,644 B2 3/2007 Narasimha et al.
(Continued)

FOREIGN PATENT DOCUMENTS

CN 101114650 A 1/2008
CN 100442462 C 12/2008
(Continued)

OTHER PUBLICATIONS

PCT International Search Report and the Written Opinion dated Oct. 8, 2018, issued in related International Application No. PCT/CN2018/093905 (7 pages).
(Continued)

*Primary Examiner* — Matthew E Warren
(74) *Attorney, Agent, or Firm* — Sheppard Mullin Richter & Hampton LLP

(57) ABSTRACT

A semiconductor device structure and fabrication method thereof are disclosed. The method may include providing a substrate; forming a gate structure on the substrate; forming a spacer structure on the gate structure, and forming a contacting conductive structure on the spacer structure. The spacer structure may cover a side wall of the gate structure, and may include a first spacer layer having a first dielectric constant and a second spacer layer having a second dielectric constant different from the first dielectric constant. The contacting conductive structure may cover a side wall of the spacer structure that is defined by a first side surface of the first spacer layer and a second side surface of the second space. The ratio of the area of the second side surface of the second spacer layer to the total area of the side wall of the spacer structure may be in a range from 78% to 98%.

3 Claims, 9 Drawing Sheets

(51) Int. Cl.
*H01L 29/417* (2006.01)
*H01L 29/49* (2006.01)

(58) Field of Classification Search
CPC ....... H01L 21/823871; H01L 29/41775; H01L 29/4983; H01L 29/66515; H01L 29/66553; H01L 29/6656; H01L 21/28123
See application file for complete search history.

(56) References Cited

U.S. PATENT DOCUMENTS

| | | | |
|---|---|---|---|
| 7,863,171 B2 | 1/2011 | Hoentschel et al. | |
| 7,884,396 B2 | 2/2011 | Costrini et al. | |
| 8,304,834 B2 | 11/2012 | Yelehanka et al. | |
| 8,642,466 B2 | 2/2014 | Kim | |
| 2002/0110966 A1 | 8/2002 | Lee | |
| 2004/0031994 A1* | 2/2004 | Lee | H01L 21/823468 257/368 |
| 2004/0259336 A1 | 12/2004 | Yeh et al. | |
| 2005/0266631 A1 | 12/2005 | Kim et al. | |
| 2006/0157750 A1* | 7/2006 | Kim | H01L 29/6653 257/288 |
| 2006/0281253 A1 | 12/2006 | Yelehanka et al. | |
| 2008/0203475 A1 | 8/2008 | Saiki et al. | |
| 2009/0218630 A1 | 9/2009 | Tsuno | |
| 2011/0210380 A1* | 9/2011 | Scheiper | H01L 21/823462 257/288 |
| 2015/0111348 A1 | 4/2015 | Yamamoto et al. | |
| 2017/0077266 A1 | 3/2017 | Cheng et al. | |
| 2017/0271162 A1* | 9/2017 | Ogata | H01L 29/42344 |
| 2018/0151679 A1* | 5/2018 | Wang | H01L 21/76855 |
| 2018/0350947 A1* | 12/2018 | Liao | H01L 21/76897 |

FOREIGN PATENT DOCUMENTS

| | | |
|---|---|---|
| CN | 101432886 A | 5/2009 |
| CN | 103456694 A | 12/2013 |
| CN | 107195550 A | 9/2017 |

OTHER PUBLICATIONS

Supplementary Search dated Mar. 14, 2018, issued in related Chinese Application No. 201710520597.6 (1 page).
Third Office Action dated Jan. 8, 2019, issued in related Chinese Application No. 201710520597.6, with English machine translation (7 pages).
First Search dated Dec. 4, 2018, issued in related Chinese Application No. 201810171911.9 (1 page).
PCT International Preliminary Report on Patentability dated Jan. 9, 2020, issued in related International Application No. PCT/CN2018/093905 (6 pages).

* cited by examiner

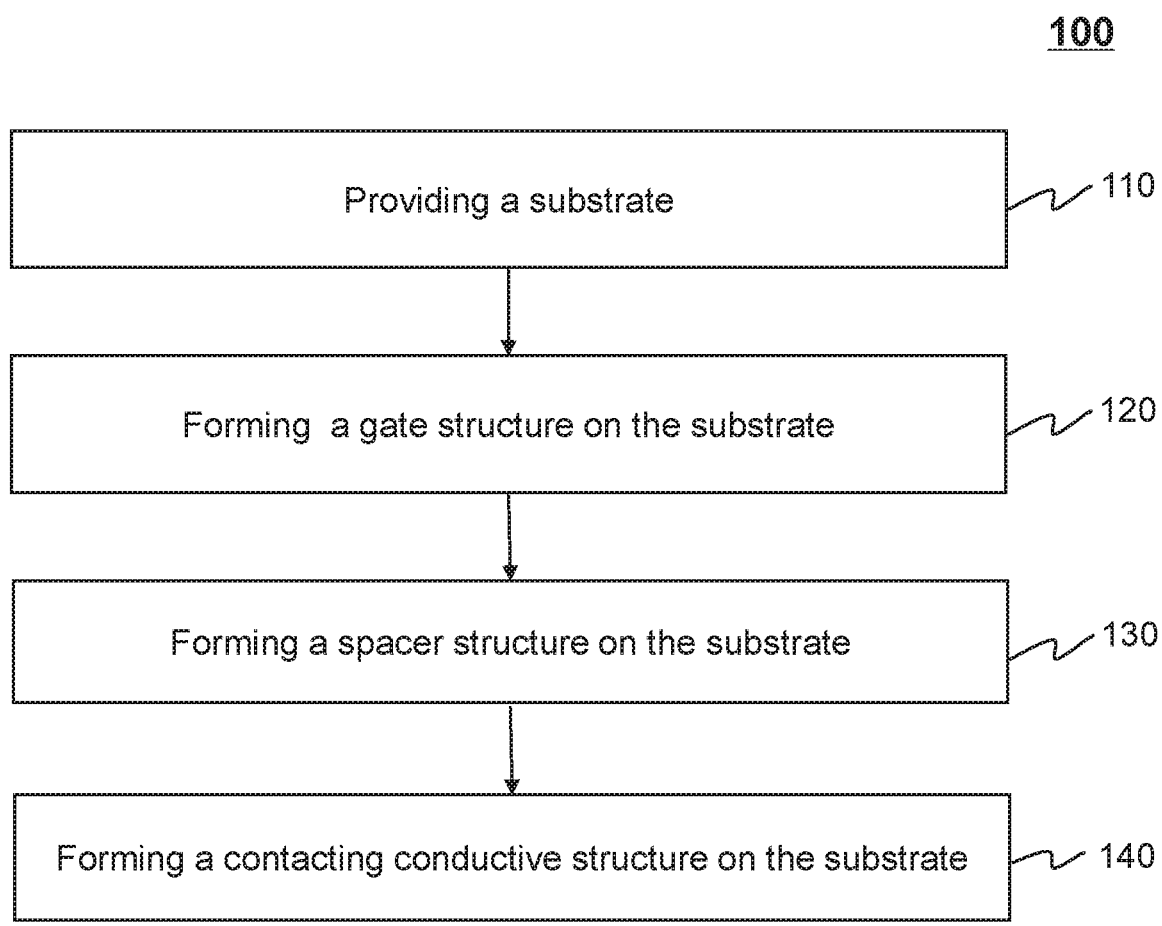
FIG. 1-A

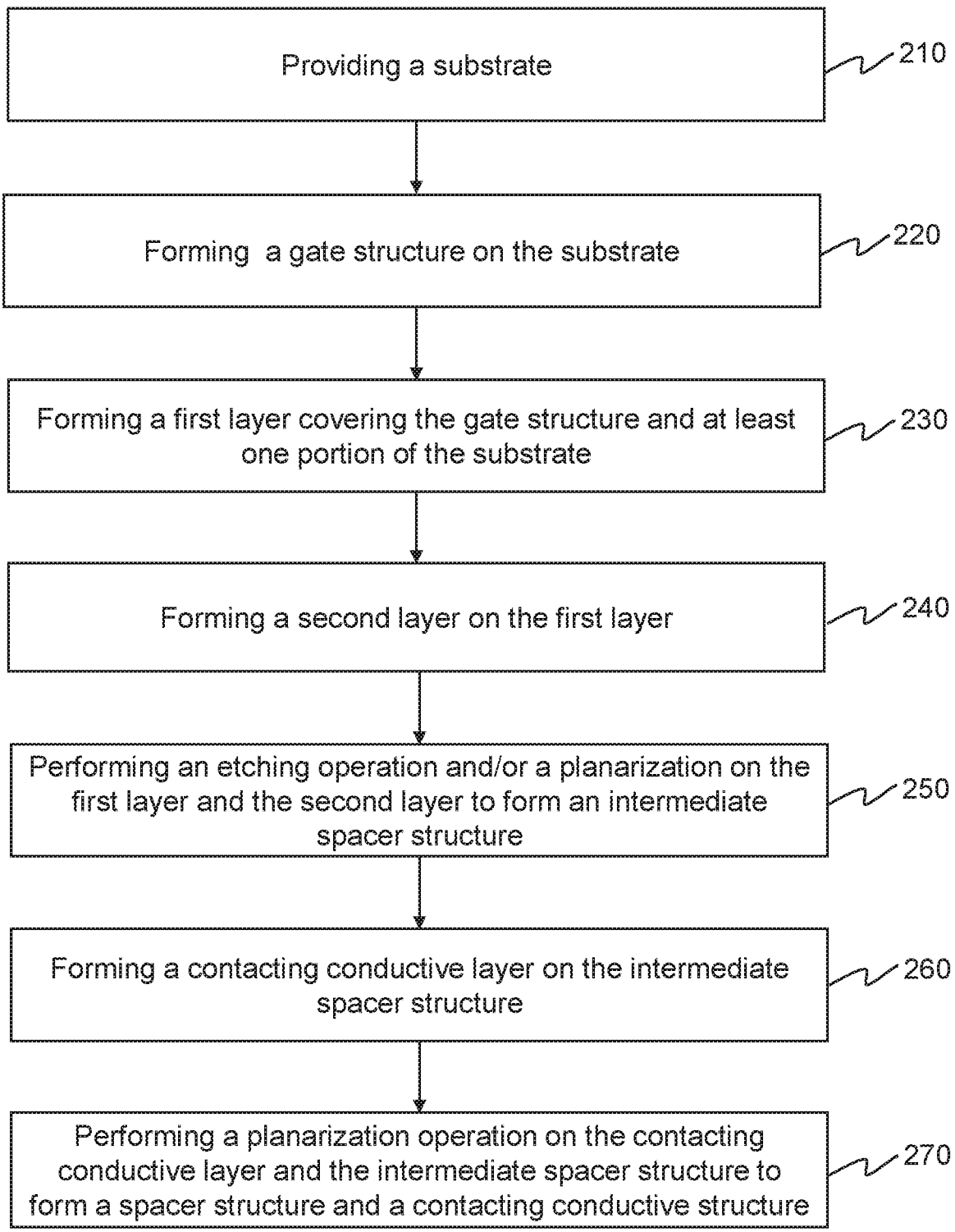
FIG. 1-B

SEMICONDUCTOR DEVICE STRUCTURES WITH COMPOSITE SPACERS AND FABRICATION METHODS THEREOF

CROSS-REFERENCE TO RELATED APPLICATION

This application is a continuation application of International Patent Application No. PCT/CN2018/093905, filed on Jun. 30, 2018, which is based on and claims priority to the Chinese Patent Application No. 201710520597.6, filed on Jun. 30, 2017 and entitled "SEMICONDUCTOR DEVICE STRUCTURES AND FABRICATION METHODS THEREOF." The above-referenced applications are incorporated herein by reference in their entirety.

TECHNICAL FIELD

The present disclosure generally relates to integrated circuits fabrication techniques, and more specifically, to semiconductor device structures and fabrication methods thereof.

BACKGROUND

In the semiconductor industry, Metal-Oxide-Semiconductor Field-Effect Transistor (MOSFET) structures are widely used in semiconductor integrated circuits (IC). In the structure of an MOSFET, an insulating layer may be formed on a side wall of a gate structure to isolate a contacting conductive layer from the gate structure and prevent device failure caused by a passage of the contacting conductive layer and the gate structure. However, a parasitic capacitance may be generated between the insulating layer and the gate structure, which may increase the resistance of the contacting conductive layer, and eventually cause the semiconductor device (i.e., MOSFET) to fail. Therefore, it is desirable to provide a semiconductor device structure and a method of manufacturing the same to prevent deterioration of the resistance of a contacting conductive layer in the semiconductor device structure.

SUMMARY

A first aspect of the present disclosure is directed to a fabrication method for a semiconductor device structure. The fabrication method may include: providing a substrate; forming a gate structure on the substrate; forming a spacer structure on the substrate covering a side wall of the gate structure and a portion of the substrate around the gate structure; and forming a contacting conductive structure on the substrate and attached to a side wall of the spacer structure.

The spacer structure may include a first spacer layer having a first dielectric constant and a second spacer layer having a second dielectric constant lower than the first dielectric constant. The first spacer layer may be attached to the side wall of the gate structure, and the second spacer layer may be attached on a side wall of the first spacer layer. The first spacer layer may include a vertical portion and a horizontal portion, the vertical portion may be attached to the side wall of the gate structure, the horizontal portion may be attached to the substrate and connected to an end of the vertical portion close to the substrate. An end of the horizontal portion away from the vertical portion may be a side surface of the first spacer layer, and the second spacer layer may be formed on the horizontal portion of the first spacer layer and attached to the vertical portion of the first spacer layer. A thickness of the second spacer layer may be greater than two times of a thickness of the vertical portion of the first spacer layer, a ratio of the thickness of the second spacer layer to the width of the gate structure in the horizontal direction may be in a range from 40% to 100%.

The side wall of the spacer structure may include the side surface of the first spacer layer and a side surface of the second spacer layer. A ratio of an area of the side surface of the second spacer layer to a total area of the side wall of the spacer structure may be in a range from 78% to 98%. A upper surface of the first spacer layer, a upper surface of the second spacer layer, a upper surface of the contacting conductive structure may be level with a upper surface of the gate structure.

Forming a spacer structure on the substrate may include: forming a first spacer material layer covering the upper surface and a side surface of the gate structure and at least one portion of the substrate around the gate structure; forming a second spacer material layer on surfaces of the first spacer material layer; and performing an etching operation and a planarization operation to expose the first spacer material layer on the gate structure, to cause a upper surface of the first spacer material layer level with a upper surface of the second spacer material layer, to form a vertical portion and a horizontal portion of the first spacer material layer, and to cause the second spacer material layer to form the second spacer layer with a pre-set width.

Forming a contacting conductive structure on the substrate and attached to a side wall of the spacer structure may include: forming a contacting conductive material layer covering the upper surface of the first spacer material layer and the upper surface of the second spacer material layer; and performing a planarization operation to expose the gate structure, and to cause the upper surface of the first spacer material layer, the upper surface of the second spacer material layer, the upper surface of the contacting conductive material layer level with the upper surface of the gate structure, and to cause the contacting conductive material layer to form two or more contacting conductive layers.

In some embodiments, forming a gate structure on the substrate may include: forming a first gate insulating material layer on the substrate; forming a gate conductive material layer on the first gate insulating material layer; forming a second gate insulating material layer on the gate conductive material layer; and performing an etching operation to form the gate structure. The gate structure may include: the first gate insulating layer formed on the substrate; the gate conductive layer formed on the first gate insulating layer; and the second gate insulating layer formed on the gate conductive layer.

In some embodiments, the aforementioned method may further include: before performing an etch operation and a planarization operation to expose the first spacer material layer, forming one or more spacer material layers alternately stacking over each other. Each of the one or more spacer material layers may be made of a material of one of the first spacer material layer and the second spacer material layer, and may be different from a material of a neighboring spacer material layer. When performing an etching operation and a planarization operation to expose the first spacer material layer, the first spacer material layer attached to the gate structure may be exposed. Upper surfaces of each of the one or more spacer material layers may be level with an upper surface of a second gate insulating layer.

A second aspect of the present disclosure is directed to a semiconductor device structure. The semiconductor device structure may include: a substrate; a gate structure formed on the substrate; a spacer structure formed on the substrate covering a side wall of the gate structure and a portion of the substrate around the gate structure, and a contacting conductive structure formed on the spacer structure and attached to a side wall of the spacer structure.

The spacer structure may include a first spacer layer having a first dielectric constant and a second spacer layer having a second dielectric constant lower than the first dielectric constant. The first spacer layer may be attached to the side wall of the gate structure, and the second spacer layer may be attached to a side wall of the first spacer layer. The first spacer layer may include a vertical portion and a horizontal portion. The vertical portion may be attached to the side wall of the gate structure, the horizontal portion may be attached to the substrate and connected to an end of the vertical portion close to the substrate. An end of the horizontal portion away from the vertical portion may be a side surface of the first spacer layer, and the second spacer layer may be formed on the horizontal portion of the first spacer layer and attached to the vertical portion of the first spacer layer. A thickness of the second spacer layer may be greater than two times of a thickness of the vertical portion of the first spacer layer, a ratio of the thickness of the second spacer layer to the width of the gate structure in the horizontal direction may be in a range of 40% to 100%.

The side wall of the spacer structure may include the side surface of the first spacer layer and a side surface of the second spacer layer. A ratio of an area of the side surface of the second spacer layer to a total area of the side wall of the spacer structure may be in a range from 78% to 98%. A upper surface of the first spacer layer, a upper surface of the second spacer layer, a upper surface of the contacting conductive structure are level with a upper surface of the gate structure.

In some embodiments, in the aforementioned device, the gate structure may include: a first gate insulating layer formed on the substrate; a gate conductive layer formed on the first gate insulating layer; and a second gate insulating layer formed on the gate conductive layer.

In some embodiments, in the aforementioned device, the side surface of the horizontal portion of the first spacer layer may be aligned with the side surface of the second spacer layer.

In some embodiments, in the aforementioned device, The spacer structure may include a plurality of first spacer layers and a plurality of second spacer layers alternately stacking over each other. The total number of first spacer layers and the second spacer layers may be N, and the first N−1 layers of the first spacer layers and the second spacer layers may each have a vertical portion and a horizontal portion. N is an integer larger than or equal to three. The bottom-most layer of the spacer structure may be a first spacer layer having the vertical portion attached to the side wall of the gate structure, and the horizontal portion attached to the substrate and connected to an end of the vertical portion close to the substrate. The $N^{th}$ layer may be one of the first spacer layer and the second spacer layer, and located on the horizontal portion of the $(N-1)^{th}$ layer.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 1A is a flowchart illustrating an exemplary process for fabricating a semiconductor device structure according to some embodiments of the present disclosure.

FIG. 1B is a flowchart illustrating another exemplary process for fabricating a semiconductor device structure according to some embodiments of the present disclosure.

DETAIL DESCRIPTION OF THE EMBODIMENTS

Figure 2:
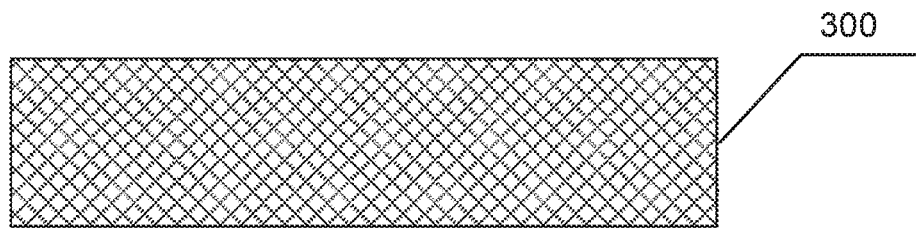
FIG. 2 is a schematic diagram illustrating an exemplary substrate of the semiconductor device structure according to some embodiments in the present disclosure.

The following description is presented to enable any person skilled in the art to make and use the present disclosure and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to some embodiments shown but is to be accorded the widest scope consistent with the claims.

The terminology used herein is for the purpose of describing particular example embodiments only and is not intended to be limiting. In some embodiments, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood, the operations of the flowchart may be implemented not in order. Conversely, the operations may be implemented in inverted order, or simultaneously. Moreover, one or more other operations may be added to the flowcharts. One or more operations may be removed from the flowcharts.

An aspect of the present disclosure relates to fabricating semiconductor device structures. The method may include providing a substrate and forming a gate structure on the substrate. The method may further include forming a spacer structure on the gate structure. The spacer structure may be attached to a side wall of the gate structure. The spacer structure may include a first spacer layer having a first dielectric constant and a second spacer layer having a second dielectric constant different from the first dielectric constant. The method may further include forming a contacting conductive structure on the spacer structure. The contacting conductive structure may be attached to a side wall of the spacer structure that is defined by a first side surface of the first spacer layer and a second side surface of the second spacer layer. A ratio of an area of the second side surface of the second spacer layer to a total area of the side wall of the spacer structure may be in a range from 78% to 98%.

FIG. 1A is a flowchart illustrating an exemplary process 100 for fabricating a semiconductor device structure according to some embodiments of the present disclosure. The operations of the illustrated process presented below are intended to be illustrative. In some embodiments, the process 100 may be accomplished with one or more additional operations not described and/or without one or more of the operations herein discussed. Additionally, the order in which the operations of the process as illustrated in FIG. 1A and described below is not intended to be limiting.

In operation 110, a substrate (e.g., a substrate 300 as illustrated in FIGS. 2-15) may be provided. In some embodiments, the substrate may be a semiconductor silicon-based substrate, such as silicon (Si) substrate, silicon-on-insulator (SOI), a monocrystalline silicon substrate, polycrystalline silicon substrate, a non-crystalline amorphous silicon, etc. In some embodiments, the substrate may be a gallium-based substrate, such as a gallium (Ge) substrate, a gallium-on-insulator substrate, etc. In some embodiments, the substrate may be a compound semiconductor substrate, such as a Silicon-Germanium (SiGe) substrate, a Gallium-Arsenic (GaAs), a Gallium-Nitrogen (GaN) substrate, a Zinc-Antimony (InSb) substrate, Zinc-Arsenic (InAs) substrate, or the like. In some embodiments, the substrate may be made of any doped silicon-containing material, e.g., intrinsic silicon, P-type silicon, N-type silicon, etc. It should be appreciated that the substrate described above are for illustration purpose. The present disclosure is not intended to limiting.

Figure 7:
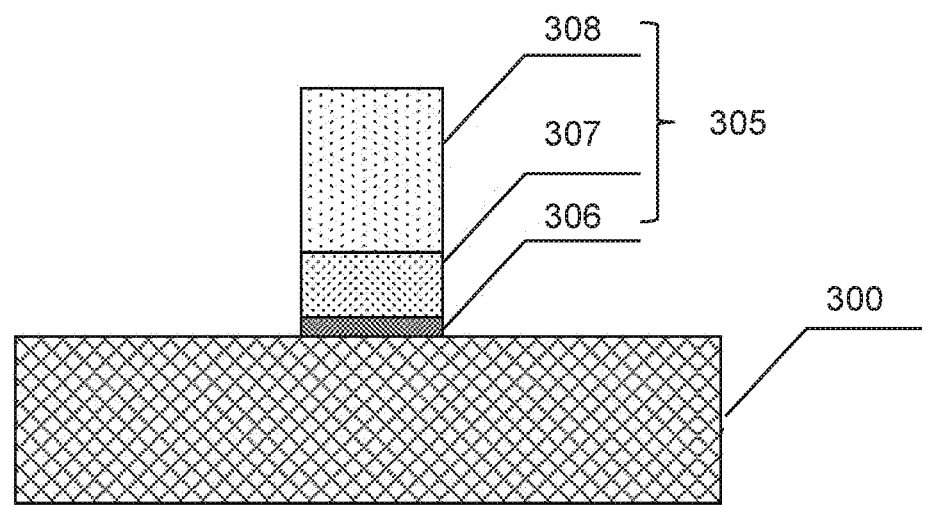
FIG. 7 is a schematic diagram illustrating an exemplary structure of a gate structure of the semiconductor device structure according to some embodiments in the present disclosure.

In operation 120, a gate structure (e.g., a gate structure 305 as illustrated in FIG. 7) may be formed on the substrate. In some embodiments, the gate structure may be formed on the substrate according to operations A1-A4 as described below.

In operation A1, a first insulating layer (e.g., a first insulating layer 301 as illustrated in FIGS. 3-6) may be formed on the substrate. In some embodiments, the first insulating layer may cover the surface of the substrate. In some embodiments, the first insulating layer may be formed on the substrate using Physical Vapor Deposition (PVD, e.g., evaporation deposition, electrodeposition, sputter deposition, etc.), Atomic Layer Deposition (ALD), Chemical Vapor Deposition (CVD), Rapid Thermal Oxidation (RTO), or other technology. The first insulating layer may be made of a first insulating material, such as silicon oxide, silicon nitride, etc. The thickness of the first insulating layer may be in a range from 1 to 10 nm, 2 to 6 nm, 3 to 5 nm, etc. For example, the thickness of the first insulating layer may be 4 nm.

Figure 4:
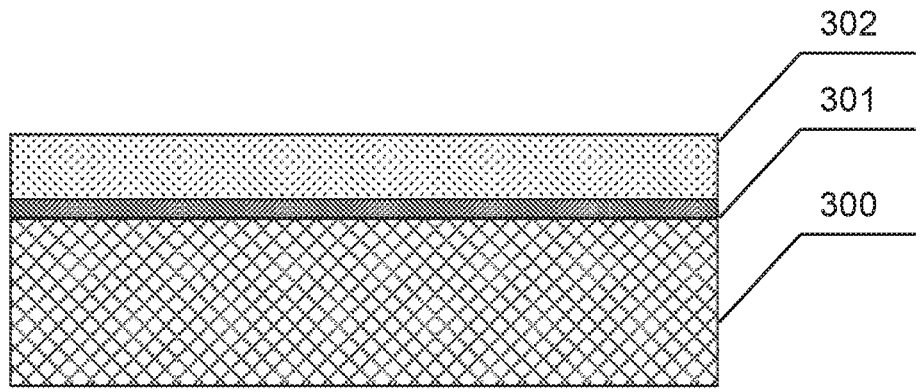
FIG. 4 is a schematic diagram illustrating an exemplary structure of a conductive layer of the semiconductor device structure some embodiments in the present disclosure.
Figure 5:
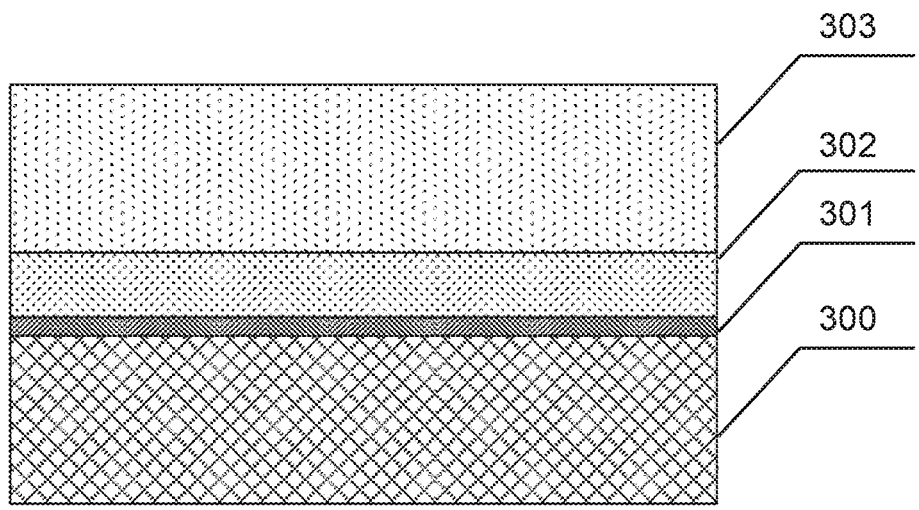
FIG. 5 is a schematic diagram illustrating an exemplary structure of a second insulating layer of the semiconductor device structure according to some embodiments in the present disclosure.
Figure 6:
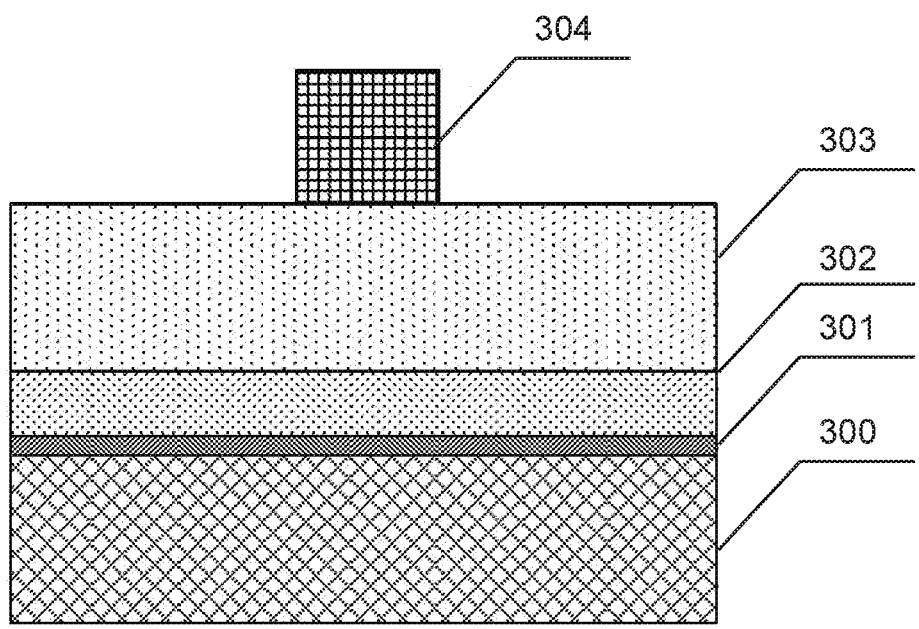
FIG. 6 is a schematic diagram illustrating exposure of a gate structure of the semiconductor device structure according to some embodiments in the present disclosure.

In operation A2, a conductive layer (e.g., a conductive layer 302 as illustrated in FIGS. 4-6) may be formed on the first insulating layer. In some embodiments, the conductive layer may cover the surface of the first insulating layer. In some embodiments, the conductive layer may be formed on the first insulating layer using Atomic Layer Deposition (ALD), Chemical Vapor Deposition (CVD), Physical Vapor Deposition (PVD, e.g., evaporation deposition, electrodeposition, sputter deposition), etc. The conductive layer may be made of a material, such as a silicon material (e.g., polysilicon, amorphous silicon, microcrystalline silicon, etc.), a metal material (e.g., tungsten, etc.), a metal doped silicon material, or the like, or a combination thereof. For example, the conductive layer may be formed by tungsten doped polysilicon. The thickness of the conductive layer may be in a range from 20 to 80 nm, or 30 to 60 nm, etc. For example, the thickness of the conductive layer may be 50 nm.

In operation A3, a second insulating layer (e.g., a second insulating layer 303 as illustrated in FIGS. 5-6) may be formed on the conductive layer. In some embodiments, the second insulating layer may cover the surface of the conductive layer. In some embodiments, the second insulating layer may be formed on the conductive layer using Physical Vapor Deposition (PVD, e.g., evaporation deposition, electrodeposition, sputter deposition, etc.), Atomic Layer Deposition (ALD), Chemical Vapor Deposition (CVD), Physical Vapor Deposition (PVD, e.g., evaporation deposition, electrodeposition, sputter deposition), Rapid Thermal Oxidation (RTO), etc. The second insulating layer may be made of a second insulating material, such as silicon nitride, silicon oxide, etc. The second insulating material of the second insulating layer may be same as or different from the first insulating material of the first insulating layer. For example, the first insulating material and the second insulating material may be both silicon oxide. As another example, the first insulating material may be silicon oxide and the second insulating material may be silicon nitride. The thickness of the second insulating layer may be in a range from 90 to 250 nm, or 100 to 150 nm, or 110 nm to 140 nm, etc. For example, the thickness of the second insulating layer may be 120 nm.

In operation A4, an etching operation may be performed on the first insulating layer, the conductive layer and/or the second insulating layer to form the gate structure. The gate structure may include a first gate insulating layer (e.g., a first gate insulating layer 306 as illustrated in FIG. 7), a gate conductive layer (e.g., a gate conductive layer 307 as illustrated in FIG. 7), and a second gate insulating layer (e.g., a second gate insulating layer 308 as illustrated in FIG. 7). In some embodiments, a desired pattern of the gate structure may be completed on the second insulating layer using a mask layer (e.g., a mask layer 304 as illustrated in FIG. 6) based on an exposing and developing technology. Using an etching technology (e.g., wet etching or dry etching), the pattern of the gate structure may be replicated on the semiconductor device structure including the substrate and the gate structure. Further, a part of the first insulating layer, a part of the conductive layer, and a part of the second insulating layer may be removed to expose a part of the substrate, and form the gate structure. The first gate insulating layer, the gate conductive layer, and the second gate insulating layer may be sequentially stacked on the substrate. More descriptions for the gate structure may be found elsewhere in the present disclosure (e.g., FIG. 7 and the descriptions thereof).

Figure 10:
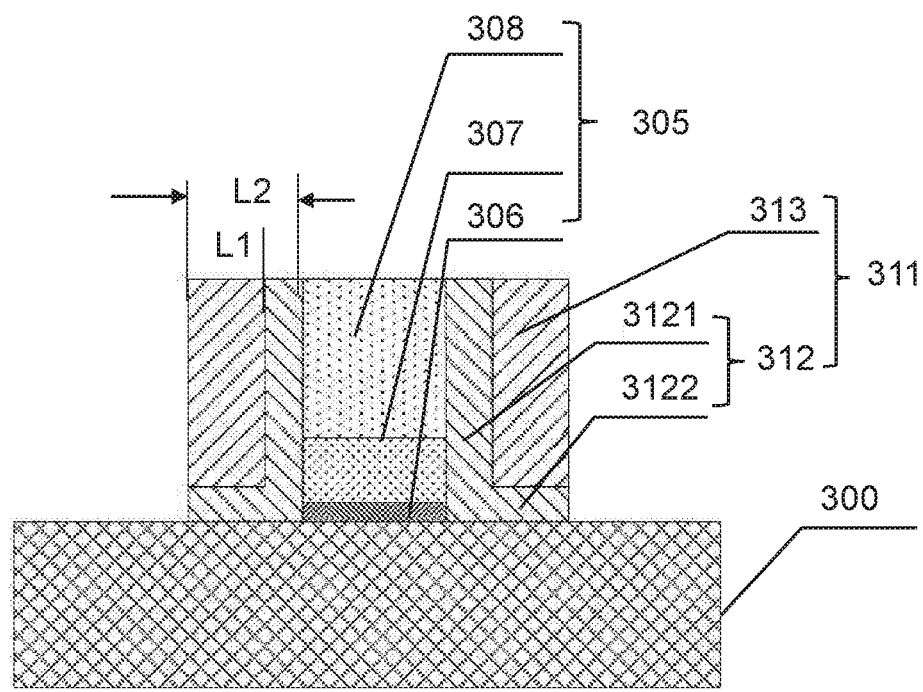
FIG. 10 is a schematic diagram illustrating an exemplary structure of a spacer structure of the semiconductor device structure according to some embodiments in the present disclosure.

In operation 130, a spacer structure (e.g., a spacer structure 311 as illustrated in FIG. 10) may be formed on the substrate. The spacer structure may be attached to and cover a side wall of the gate structure and at least one portion of the substrate around the gate structure. The thickness of the spacer structure may be in a range from 20 to 85 nm, or 25 to 80 nm, etc. For example, the thickness of the spacer structure may be 58 nm. As used herein, the thickness of the spacer structure refers to a distance between the side wall of the gate structure and the side wall of the spacer structure.

The spacer structure may include a first spacer layer (e.g., a first spacer layer 312 as illustrated in FIG. 10) and a second spacer layer (e.g., a second spacer layer 313 as illustrated in FIG. 10). The first spacer layer may cover the side wall of the gate structure. The first spacer layer may be made of an insulating material having a first dielectric constant, such as silicon oxide ($SiO_2$), silicon nitride ($Si_3N_4$), etc. The thickness of the first spacer layer (i.e., the thickness of the vertical portion of the first spacer layer) may be in a range from 2 to 15 nm, or 5 to 10 nm, etc. For example, the thickness of the first spacer layer may be 8 nm.

The first spacer layer may include a vertical portion (e.g., a vertical portion 3121 as illustrated in FIG. 10) and a horizontal portion (e.g., a horizontal portion 3122 as illustrated in FIG. 10). The vertical portion (e.g., a vertical portion 3121 as illustrated in FIG. 10) of the first spacer layer may be attached to and cover the side wall of the gate structure. An end of the vertical portion may be attached to the substrate. The horizontal portion (e.g., a horizontal portion 3122 as illustrated in FIG. 10) may be attached to and cover the at least one portion of the substrate around the gate structure. The horizontal portion may be connected with the end of the vertical portion. A side surface of the horizontal portion may form one portion of the side wall of the first spacer layer.

The second spacer layer may be made of an insulating material having a second dielectric constant, such as silicon oxide ($SiO_2$), silicon nitride ($Si_3N_4$), etc. In some embodiments, the second dielectric constant may be lower than the first dielectric constant. For example, the first spacer layer may be made of silicon nitride ($Si_3N_4$), and the second spacer layer may be made of silicon oxide ($SiO_2$). The thickness of the second spacer layer may be greater than that of the first spacer layer. For example, the thickness of the second spacer layer may be greater than two times of the thickness of the first spacer layer. As another example, the thickness of the second spacer layer may be three times of the thickness of the first spacer layer. In some embodiments, a ratio of the thickness of the second spacer layer (e.g., L1 as shown in FIG. 10) to the width of the gate structure in the horizontal direction (e.g., the width of the gate structure 305 in the horizontal direction as shown in FIG. 10) may be in a range from 40% to 100%. In some embodiments, the thickness of the second spacer layer may be in a range from 20 to 70 nm, or 40 to 60 nm, etc. For example, the thickness of the second spacer layer may be 50 nm. In some embodiments, a ratio of an area of the side surface of the second spacer layer to a total area of the side wall of the spacer structure may be in a range from 78% to 98%, or 80% to 90%, etc. For example, the ratio of an area of the side surface of the second spacer layer to a total area of the side wall of the spacer structure may be 80%. The side wall of the spacer structure may be defined by the side surface of the horizontal portion of the first spacer layer and the side surface of the second spacer layer.

The second spacer layer may cover the side surface of the first spacer layer that is defined by the side surface of the vertical portion and the upper surface of the horizontal portion of the first spacer layer. Further, the second spacer layer may be formed on the horizontal portion of the first spacer layer. In some embodiments, the second spacer layer may cover a portion of the upper surface of the horizontal portion, i.e., the width of the horizontal portion of the first spacer layer may be greater than the thickness of the second spacer layer. The side surface of the horizontal portion of the first spacer layer and the side surface of the second spacer layer may be aligned to the same vertical plane. In some embodiments, the second spacer layer may completely cover the upper surface of the horizontal portion, i.e., the width of the horizontal portion of the first spacer layer may be equal to the thickness of the second spacer layer. As used herein, the width of the horizontal portion of the first spacer layer may refer to a distance between the side surface of the vertical portion of the first spacer layer attaching to the second spacer layer to the side wall of the conductive structure.

It should be noted that a capacitance between two parallel conductive layers may be determined according to Equation (1) as follows:

$$C=\varepsilon A/d \qquad (1)$$

where C refers to the capacitance between two parallel conductive layers, ε refers to a dielectric constant, A refers to an area of one of the parallel conductive layers, and d refers to a distance between the two parallel conductive layers (e.g., the gate structure and the contacting conductive structure). According to the present disclosure, the distance between the gate structure and the contacting conductive structure d may be a constant equal to the thickness of the spacer structure. The spacer structure may be formed by at least two spacers (e.g., the first spacer layer and the second spacer layer), and the dielectric constants of the two spacers may be different (e.g., the first spacer layer with a higher dielectric constant and the second spacer layer with a lower dielectric constant), which may decrease the dielectric constant of the spacer structure. For example, a spacer structure may include a silicon nitride ($Si_3N_4$) layer, whose dielectric constant of $Si_3N_4$ is 7.5, while a composite spacer structure may include a silicon nitride ($Si_3N_4$) layer (i.e., the first spacer layer) and a silicon oxide ($SiO_2$) layer (i.e., the second spacer layer) whose dielectric constants is 3.9. The composite spacer may have excellent anti-etching strength and a comparatively low dielectric constant comparing to the spacer structure including the silicon nitride ($Si_3N_4$) layer, which can prevent resistance deterioration of the contacting conductive structure caused by parasitic capacitance derived from a semiconductor device, thereby preventing failure of the semiconductor device.

In some embodiments, the spacer structure may be formed on the substrate according to operations B1-B3 as described below. In some embodiments, the spacer structure may be formed according to process 200 as described in FIG. 1B.

Figure 8:
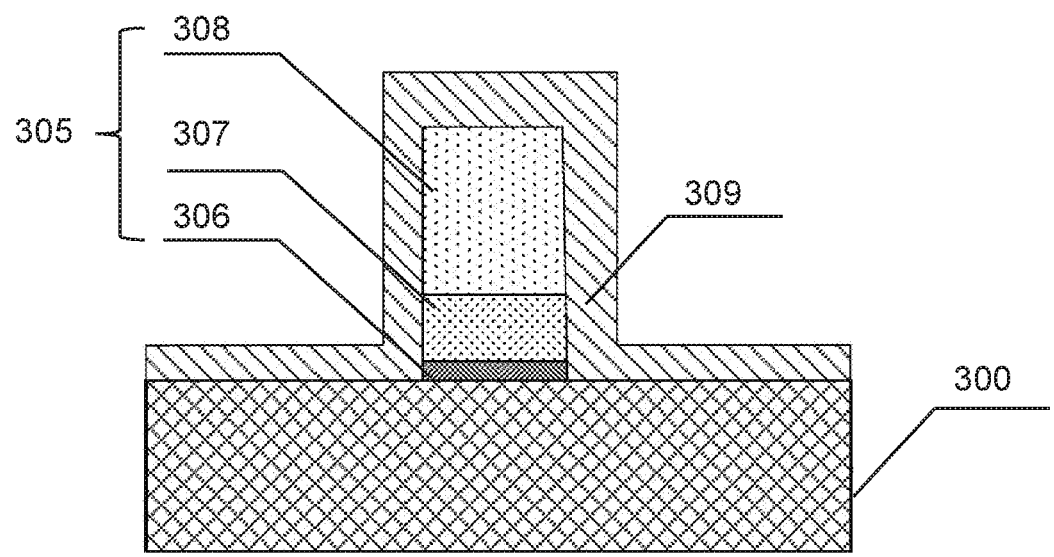
FIG. 8 is a schematic diagram illustrating an exemplary structure of a first spacer material layer of the semiconductor device structure according to some embodiments in the present disclosure.
Figure 9:
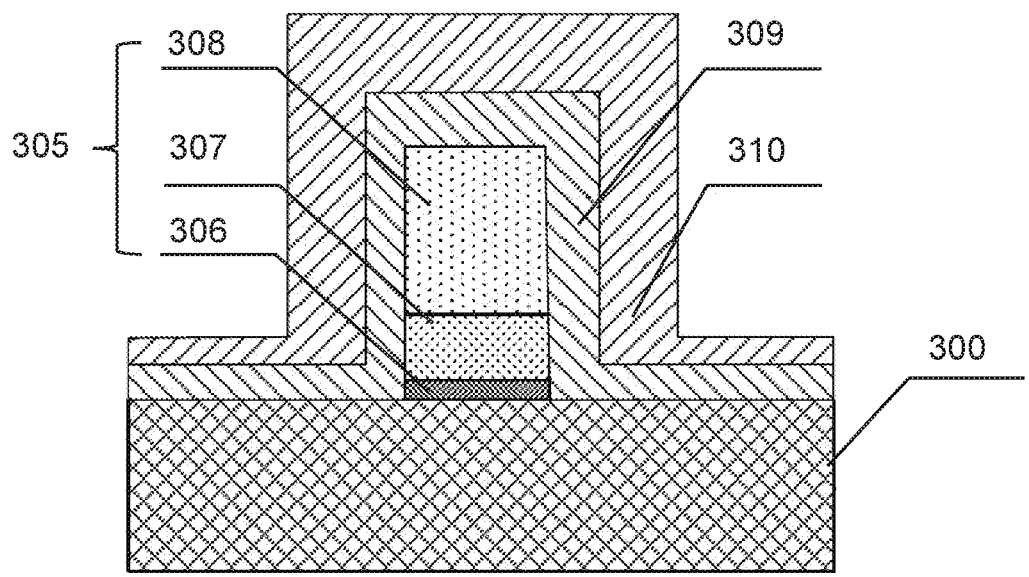
FIG. 9 is a schematic diagram illustrating an exemplary structure of a second spacer material layer of the semiconductor device structure according to some embodiments in the present disclosure.

In operation B1, a first spacer material layer (e.g., a first spacer material layer 309 as illustrated in FIGS. 8-9) covering the gate structure and at least one portion of the substrate may be formed. In some embodiments, the first spacer material layer may be formed by Chemical Vapor Deposition (CVD), plasma enhanced chemical vapor deposition (PECVD) (e.g., a monolithic reaction chamber, a batch reaction chamber, etc.), Physical Vapor Deposition (PVD, e.g., evaporation deposition, electrodeposition, sputter deposition, etc.), Atomic Layer deposition (ALD) (not limited to monolithic or batch reactors), etc. In the process for forming the first spacer material layer, the processing gas may be monosilane ($SiH_4$), dichlorosilane ($SiH_2Cl_2$), silicon tetrachloride ($SiCl_4$), ammonia ($NH_3$), etc. The processing pressure may be in a range from 0.1 to 100 torr, or 10 to 60 torr, etc. For example, the processing pressure may be 30 torr. The processing temperature may be in a range from 350 to 800° C., or 500 to 700° C., etc. For example, the processing temperature may be 600° C. More descriptions for the first spacer material layer may be found elsewhere in the present disclosure (e.g., FIG. 8 and the descriptions thereof).

In operation B2, a second spacer material layer (e.g., a second spacer material layer 310 as illustrated in FIG. 9) may be formed on the first spacer material layer. The second spacer material layer may cover the first spacer material layer. In some embodiments, the second spacer material layer may be formed by chemical vapor deposition (CVD), plasma enhanced chemical vapor deposition (PECVD) (e.g., a monolithic reaction chamber, a batch reaction chamber, etc.), Physical Vapor Deposition (PVD, e.g., evaporation deposition, electrodeposition, sputter deposition), Atomic Layer Deposition (ALD) (e.g., a monolithic reaction chamber, a batch reaction chamber, etc.), etc. During the formation of the second spacer material layer, the processing gas may be methansilane ($SiH_4$), four silicon chloride ($SiCl_4$), four acetyl silicon (TEOS), amino silane (LTO-520), double (two ethyl amide) silane (N-Zero), double (tert butyl amino) silane (BTBAS), hexachlorhexane (HCDS), 3DMAS, oxygen ($O_2$), etc. The processing pressure may be in a range from 0.1 to 100 torr, or 10 to 60 torr, etc. For example, the processing pressure may be 30 torr. The processing temperature may be in a range from 20 to 600° C., or 80 to 400° C., etc. For example, the processing temperature may be 150° C. More descriptions for the second spacer material layer may be found elsewhere in the present disclosure (e.g., FIG. 9 and the descriptions thereof).

In operation B3, an etching operation and a planarization operation may be performed on the first spacer material layer and the second spacer material layer to form the first spacer layer (e.g., a first spacer layer 312 as illustrated in FIG. 10) and the second spacer layer (e.g., a second spacer layer 313 as illustrated in FIG. 10) of the spacer structure (e.g., a spacer structure 311 as illustrated in FIG. 10). At least one portion of the first spacer material layer and the second spacer material layer may be removed using the etching operation to expose at least one portion of the substrate. The gate structure (e.g., the second gate insulating layer) may be exposed using the planarization operation. Further, an upper surface of the first spacer layer, an upper surface of the second spacer layer, and an upper surface of the gate structure (e.g., the second insulating layer) may be at the same level. In some embodiments, the planarization operation may include a chemical mechanical planarization (CMP), a spin-on glass planarization, a deposit and etchback, etc. The first spacer material layer may be used to form the vertical portion (e.g., a vertical portion 3121 as shown in FIG. 10) and the horizontal portion (e.g., a horizontal portion 3122 as shown in FIG. 10) of the first spacer layer. The second spacer material layer may be used to form the second spacer layer (e.g., a second spacer layer 313 as shown in FIG. 10).

Figure 14:
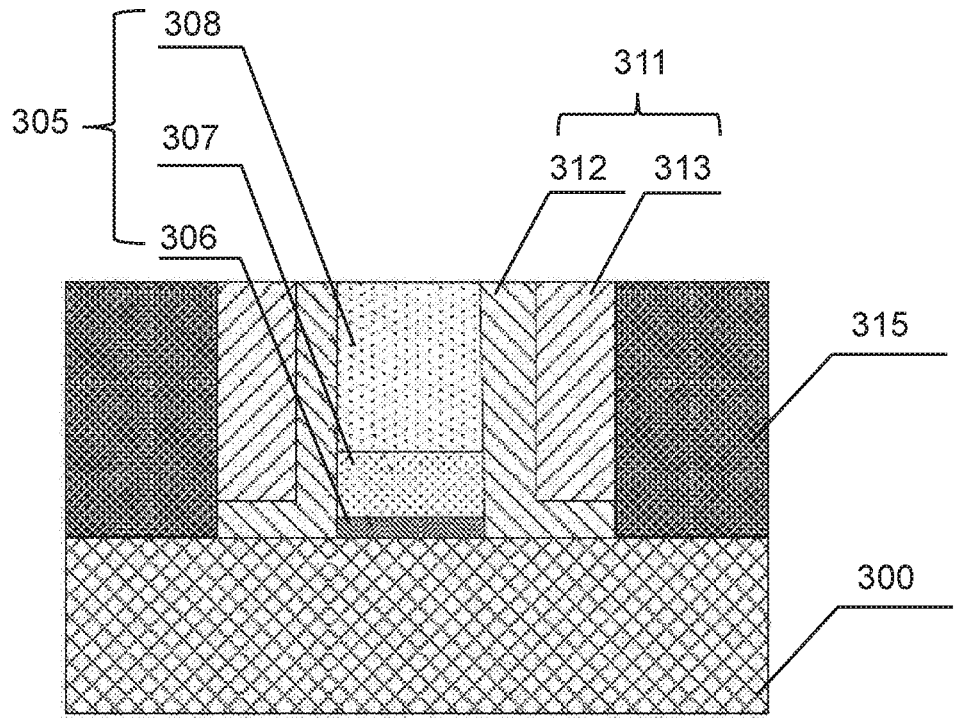
FIG. 14 is a schematic diagram illustrating an exemplary structure of a semiconductor device structure according to some embodiments in the present disclosure.
Figure 15:
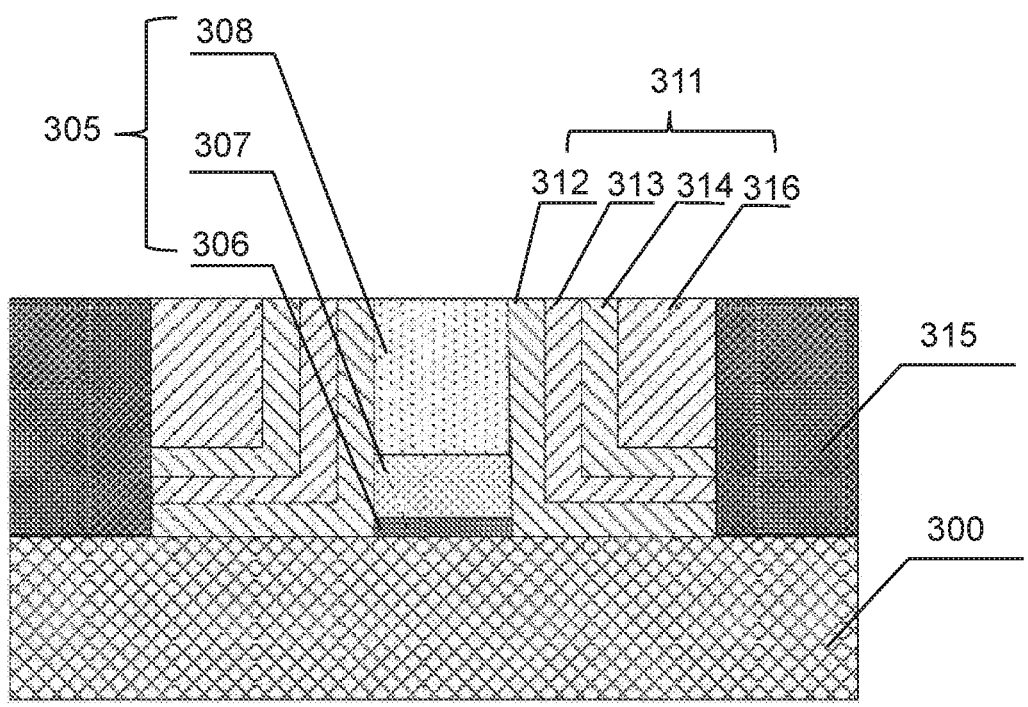
FIG. 15 is a schematic diagram illustrating another exemplary structure of a semiconductor device structure according to some embodiments in the present disclosure.

In operation 140, a contacting conductive structure (e.g., a contacting conductive structure 315 as illustrated in FIGS. 14-15) may be formed on the substrate. The contacting conductive structure may be attached to the side wall of the spacer structure that is defined by the side surface of the horizontal portion of the first spacer layer and the side surface of the second spacer layer. In some embodiments, the contacting conductive structure may completely cover the side wall of the spacer structure. The height of the contacting conductive structure may be equal to the height of the spacer structure. In other words, the upper surface of the spacer structure and the upper surface of the contacting conductive structure may be at the same level. In some embodiments, the contacting conductive structure may cover one portion of the side wall of the spacer structure. The height of the contacting conductive structure may be lower than the height of the spacer structure. A ratio of the height of the contacting conductive structure to the height of the spacer structure may be in a range from 40% to 90%. The ratio of the height of the contacting conductive structure to the height of the spacer structure may be also referred to as a covering rate for the contacting conductive structure covering the side wall of the spacer structure. In some embodiments, the height of the contacting conductive structure may be in a range from 110 to 250 nm, or 150 to 200 nm, etc. The thickness of the contacting conductive structure may be in a range from 50 to 300 nm, or 70 to 90 nm, etc. For example, the thickness of the contacting conductive structure may be 80 nm.

In some embodiments, the contacting conductive structure may be formed after the spacer structure is formed according to operations C1-C2 as described below. In some embodiments, the contacting conductive structure and the spacer structure may be formed simultaneously according to process 200 as described in FIG. 1B.

Figure 13:
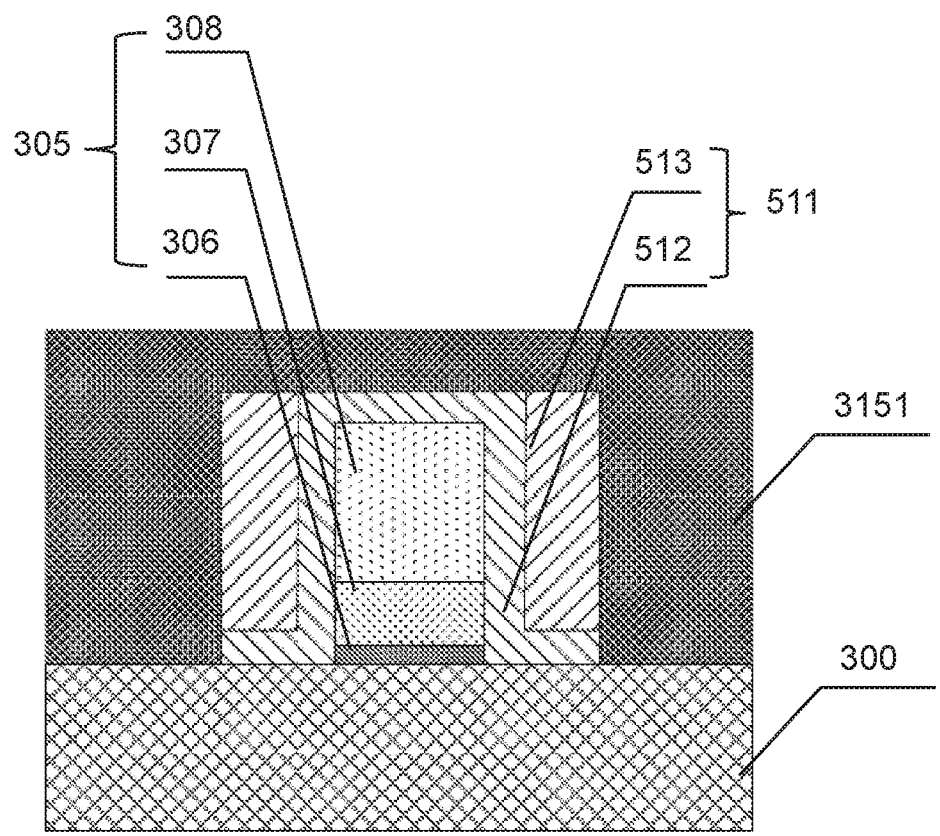
FIG. 13 is a schematic diagram illustrating another exemplary structure of a contacting conductive layer of the semiconductor device structure according to some embodiments in the present disclosure.

In operation C1, a contacting conductive layer (e.g., a contacting conductive layer 3151 as illustrated in FIG. 13) covering the gate structure, the spacer structure, and at least one portion of the substrate may be formed. The contacting conductive layer may be formed using Atomic Layer Deposition (ALD) or Chemical Vapor Deposition (CVD), or the like. The contacting conductive layer may be made of a conductive material, such as W (Tungsten), Ti (Titanium), Ni (Nickel), Al (Aluminum), Cu (Copper), etc.

In operation C2, a planarization operation may be performed on the contacting conductive layer to expose the gate structure and form the contacting conductive structure. In some embodiments, the upper surface of the contacting conductive structure, the upper surface of the spacer structure, and the upper surface of the gate structure may be at the same level. In some embodiments, the planarization operation may cause the upper surface of the contacting conductive layer to be lower than the upper surface of the spacer structure.

It should be noted that the foregoing embodiments are merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, the first spacer layer may be made of silicon oxide ($SiO_2$), and the second spacer layer may be made of silicon nitride ($Si_3N_4$). In some embodiments, the first spacer layer may only include the vertical portion. The first spacer layer and the second spacer layer may be alternately formed on the substrate.

FIG. 1B is a flowchart illustrating another exemplary process 200 for fabricating a semiconductor device structure according to some embodiments of the present disclosure. The operations of the illustrated process presented below are intended to be illustrative. In some embodiments, the process 200 may be accomplished with one or more additional operations not described and/or without one or more of the operations herein discussed. Additionally, the order in which the operations of the process as illustrated in FIG. 1B and described below is not intended to be limiting. Operation 130 and operation 140 may be performed according to operations 230-270 as described in FIG. 1B.

In operation 210, a substrate (e.g., a substrate 300 as illustrated in FIGS. 2-15) may be provided. More descriptions for providing the substrate may be found elsewhere in the present disclosure (e.g., FIG. 1A and FIG. 2, and the descriptions thereof). For example, the substrate may be formed as described in connection with operation 110 in FIG. 1A.

In operation 220, a gate structure (e.g., a gate structure 305 as illustrated in FIG. 7) may be formed on the substrate. More descriptions for forming the gate structure may be found elsewhere in the present disclosure (e.g., FIG. 1A and FIGS. 3-7, and the descriptions thereof). For example, the gate structure may be formed as described in connection with operation 120 in FIG. 1A.

In operation 230, a first spacer material layer (e.g., a first spacer material layer 309 as illustrated in FIG. 8) covering a gate structure (e.g., a gate structure 305 as illustrated in FIG. 7) and at least one portion of the substrate may be formed. The first spacer material layer may be made of an insulating material having a first dielectric constant, such as silicon nitride. More descriptions for forming the first spacer material layer may be found elsewhere in the present disclosure (e.g., FIG. 1A and FIG. 8, and the descriptions thereof). For example, the first spacer material layer may be formed as described in connection with operation B1 in FIG. 1A.

In operation 240, a second spacer material layer (e.g., a second spacer material layer 310 as illustrated in FIG. 9) may be formed on the first spacer material layer. The second spacer material layer may cover the first spacer material layer. The second spacer material layer may be made of an insulating material having a second dielectric constant, such as silicon oxide. The second dielectric constant may be smaller than the first dielectric constant. More descriptions for the operation 240 may be found elsewhere in the present disclosure (e.g., FIG. 1A and FIG. 9, and the descriptions thereof). For example, the second spacer material layer may be formed as described in connection with operation B2 in FIG. 1A.

In operation 250, an etching operation and/or a planarization operation may be performed on the first spacer material layer and/or the second spacer material layer to form an intermediate spacer structure.

Figure 11:
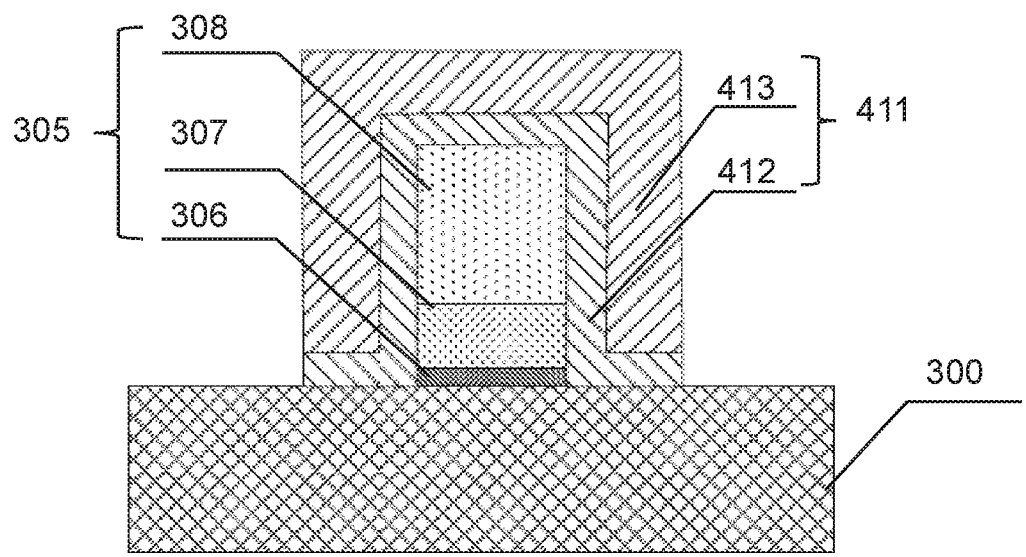
FIG. 11 is a schematic diagram illustrating an exemplary structure of an intermediate spacer structure of the semiconductor device structure according to some embodiments in the present disclosure.
Figure 12:
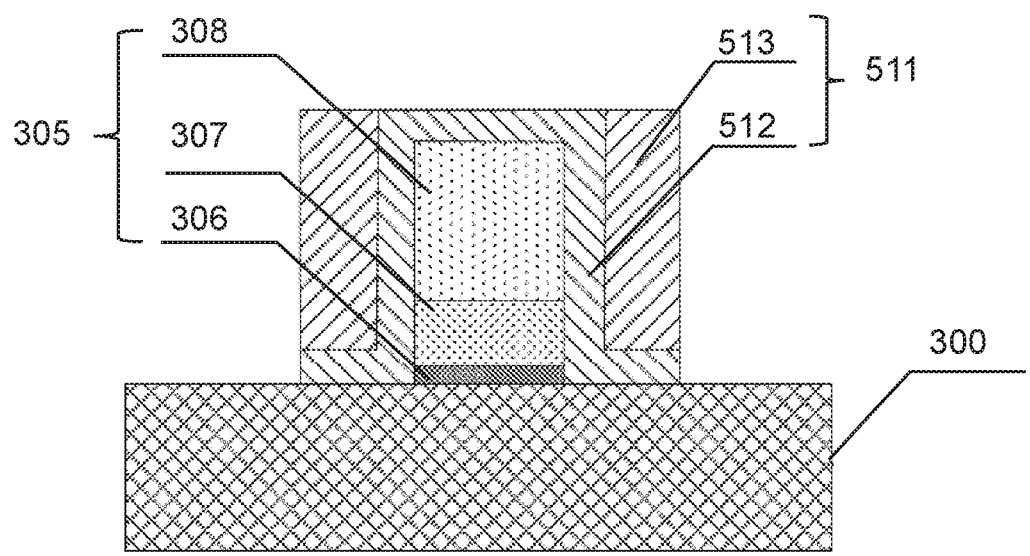
FIG. 12 is a schematic diagram illustrating another exemplary structure of an intermediate spacer structure of the semiconductor device structure according to some embodiments in the present disclosure.

In some embodiments, the etching operation may be performed on the first spacer material layer and the second spacer material layer to form a first intermediate spacer structure (e.g., a first intermediate spacer structure 411 as illustrated in FIG. 11). The etching operation may be performed to expose at least one portion of the substrate. Further, the planarization operation may be performed on the first intermediate spacer structure (e.g., a first intermediate spacer structure 411 as illustrated in FIG. 11) to form a second intermediate spacer structure (e.g., a second intermediate spacer structure 511 as shown in FIG. 12) or a spacer structure (e.g., a spacer structure 311 as shown in FIG. 10).

In some embodiments, the planarization operation may be performed on the first spacer material layer and/or the second spacer material layer to form a third intermediate spacer structure. The first spacer material layer or the gate structure may be exposed in the third intermediate spacer structure. Then the etching operation may be performed on the third intermediate spacer structure to expose at least one portion of the substrate and form the second intermediate spacer (e.g., a second intermediate spacer structure 511 as shown in FIG. 12) or a spacer structure (e.g., a spacer structure 311 as shown in FIG. 10).

In operation 260, a contacting conductive layer (e.g., a contacting conductive layer 3151 as illustrated in FIG. 13) may be formed on the intermediate spacer structure. In some embodiments, the contacting conductive layer may be formed on and cover the first intermediate spacer structure (e.g., the first intermediate spacer structure 411) as shown in FIG. 11. In some embodiments, the contacting conductive layer may be formed on and cover the second intermediate spacer structure (e.g., the second intermediate spacer 511) as shown in FIG. 13. In some embodiments, the contacting conductive layer may be formed using Atomic Layer Deposition (ALD), Chemical Vapor Deposition (CVD), Rapid Thermal Oxidation (RTO), etc.

In operation 270, a planarization operation may be performed on the contacting conductive layer and the intermediate spacer structure to form the spacer structure and the contacting conductive structure. After the planarization operation, the gate structure may be exposed. An upper surface of the spacer structure, an upper surface of the contacting conductive structure, and an upper surface of the gate structure may be at the same level. The semiconductor may be fabricated as shown in FIG. 14. In some embodiments, the planarization operation may be performed on the contacting conductive layer and the first intermediate spacer structure (e.g., a first intermediate spacer structure 411 as illustrated in FIG. 11). In some embodiments, the planarization operation may be performed on the contacting conductive layer and the second intermediate spacer structure (e.g., a second intermediate spacer structure 511 as illustrated in FIG. 12).

It should be noted that the foregoing embodiments are merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, process 200 may further include forming one or more third layers on the second spacer material layer. Each of the third layers may be made of an insulating material having a dielectric constant lower than the first dielectric constant. The one or more third layers may be used to form one or more third spacers (e.g., a third spacer 314, a fourth spacer 316, etc.) as described in FIG. 15. As another example, operation 250 may just include performing the etching operation on the first spacer material layer and the second spacer material layer to form the intermediate spacer structure.

FIG. 2 is a schematic diagram illustrating an exemplary substrate of the semiconductor device structure provided in operation 110 (or operation 210) according to some embodiments in the present disclosure. As shown in FIG. 2, after operation 110 is performed, the semiconductor device structure includes a substrate 300. The substrate may be a semiconductor silicon-based substrate, such as silicon (Si) substrate, silicon-on-insulator (SOI), a monocrystalline silicon substrate, polycrystalline silicon substrate, a non-crystalline amorphous silicon, etc. In some embodiments, the substrate may be a gallium-based substrate, such as a gallium (Ge) substrate, a gallium-on-insulator substrate, etc. In some embodiments, the substrate may be a compound semiconductor substrate, such as a Silicon-Germanium (SiGe) substrate, a Gallium-Arsenic (GaAs), a Gallium-Nitrogen (GaN) substrate, a Zinc-Antimony (InSb) substrate, Zinc-Arsenic (InAs) substrate, or the like. In some embodiments, the substrate may be made of any doped silicon-containing material, e.g., intrinsic silicon, P-type silicon, N-type silicon, etc.

FIGS. 3, 4, 5, 6, and 7 are schematic diagrams illustrating a gate structure of the semiconductor device structure based on operation 120 according to some embodiments of the present disclosure. According to the embodiments shown in FIGS. 3, 4, 5, 6, and 7, after operation 120 is performed, the semiconductor device structure includes the substrate 300 and a gate structure 305 as shown in FIG. 7.

Figure 3:
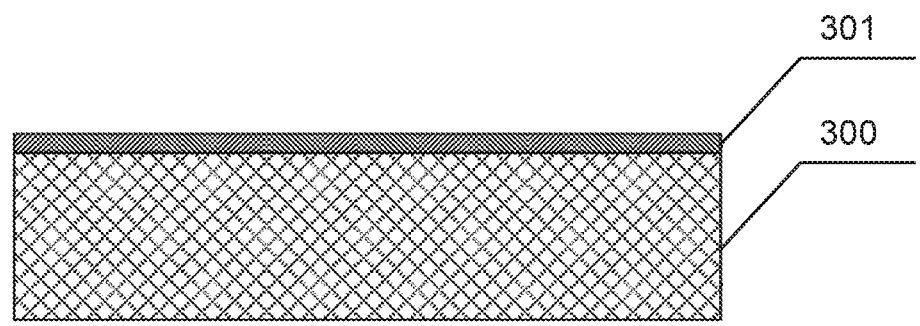
FIG. 3 is a schematic diagram illustrating an exemplary structure of a first insulating layer of the semiconductor device structure according to some embodiments in the present disclosure.

FIG. 3 is a schematic diagram illustrating an exemplary structure of a first insulating layer of the semiconductor device structure according to some embodiments in the present disclosure. As shown in FIG. 3, after operation A1, a first insulating layer 301 is formed on the substrate 300. In some embodiments, the first insulating layer 301 may be formed on the substrate using Atomic Layer Deposition (ALD), Chemical Vapor Deposition (CVD), Rapid Thermal Oxidation (RTO), etc. The first insulating layer 301 may be made of an insulating material, such as silicon oxide, silicon nitride, etc. The thickness of the first insulating layer 301 may be in a range from 1 to 10 nm, or 2 to 6 nm, etc. For example, the thickness of the first insulating layer 301 may be 4 nm.

FIG. 4 is a schematic diagram illustrating an exemplary structure of a conductive layer of the semiconductor device structure some embodiments in the present disclosure. As shown in FIG. 4, after operation A2, a conductive layer 302 is formed on the first insulating layer 301. In some embodiments, the conductive layer 302 may cover the surface of the first insulating layer 301. In some embodiments, the conductive layer 302 may be formed on the first insulating layer 301 using Atomic Layer Deposition (ALD), Chemical Vapor Deposition (CVD), Physical Vapor Deposition (PVD, e.g., evaporation deposition, electrodeposition, sputter deposition), etc. The conductive layer 302 may be made of a material, such as a silicon material (e.g., polysilicon, amorphous silicon, microcrystalline silicon, etc.), a metal material (e.g, tungsten, etc.), a metal doped silicon material, or the like, or a combination thereof. For example, the conductive layer 302 may be formed by tungsten doped polysilicon. The thickness of the conductive layer 302 may be in a range from 20 to 80 nm, or 30 to 60 nm, etc. For example, the thickness of the conductive layer 302 may be 50 nm.

FIG. 5 is a schematic diagram illustrating an exemplary structure of a second insulating layer of the semiconductor device structure according to some embodiments in the present disclosure. As shown in FIG. 5, after operation A3, a second insulating layer 303 is formed on the conductive layer 302. The second insulating layer 303 may be made of a second insulating material, such as silicon nitride, silicon oxide, etc. In some embodiments, the second insulating material of the second insulating layer 303 may be same as or different from the first insulating material of the first insulating layer 301. For example, the first insulating material and the second insulating material may be the same silicon oxide. As another example, the first insulating material may be silicon oxide and the second insulating material may be silicon nitride. The thickness of the second insulating layer 303 may be in a range from 90 to 250 nm, or 100 to 150 nm, or 110 nm to 140 nm etc. In some embodiments, the thickness of the second insulating layer 303 may be 120 nm.

FIG. 6 is a schematic diagram illustrating an exposure operation of a gate structure of the semiconductor device structure according to some embodiments in the present disclosure. FIG. 7 is a schematic diagram illustrating an exemplary structure of a gate structure of the semiconductor device structure according to some embodiments in the present disclosure. As shown in FIGS. 6 and 7, after operation A4, the gate structure is formed on the substrate 300. An etching operation may be performed on the first insulating layer 301, the conductive layer 302 and/or the second insulating layer 303 to form the gate structure. The gate structure may include a first gate insulating layer 306, a gate conductive layer 307, and a second gate insulating layer 308. In some embodiments, using an exposing and developing technology, a desired pattern of the gate structure may be completed on the second insulating layer 303 using a mask layer 304. Using an etching technology (e.g., wet etching or dry etching), the pattern of the gate structure may be replicated on the semiconductor device structure including the substrate and the gate structure. Further, a part of the first insulating layer 301, a part of the conductive layer 302, and a part of the second insulating layer 303 may be removed to expose a part of the substrate, and form the gate structure. The first gate insulating layer 306, the gate conductive layer 307, and the second gate insulating layer 308 may be sequentially stacked on the substrate 300.

FIGS. 8, 9, and 10 are schematic diagrams illustrating a spacer structure of the semiconductor device structure based on operation 130 (or operation 230) according to some embodiments in the present disclosure. According to the embodiment shown in FIGS. 8, 9, and 10, after operation 130 is performed, the semiconductor device structure includes the substrate 300, the gate structure 305, and a spacer structure 311 as shown in FIG. 10.

FIG. 8 is a schematic diagram illustrating an exemplary structure of a first spacer material layer of the semiconductor device structure according to some embodiments in the present disclosure. As shown in FIG. 8, after operation B1 is performed, a first spacer material layer 309 is formed. The first spacer material layer 309 may cover the gate structure 305 and at least one portion of the substrate 300. In some embodiments, the first spacer material layer 309 may be formed by chemical vapor deposition (CVD), plasma enhanced chemical vapor deposition (PECVD) (not limited to a monolithic or batch reaction chamber), Physical Vapor Deposition (PVD, e.g., evaporation deposition, electrodeposition, sputter deposition), etc. In some embodiments, the first spacer material layer 309 may be accomplished by Atomic Layer deposition (ALD) (not limited to monolithic or batch reactors). In the process for forming the first spacer material layer 309, the processing gas may be monosilane ($SiH_4$), dichlorosilane ($SiH_2Cl_2$), silicon tetrachloride ($SiCl_4$), ammonia ($NH_3$), etc. The processing pressure may be 0.1 to 100 torr, or 10 to 60 torr, etc. For example, the processing pressure may be 30 torr. The processing temperature may be in a range from 350 to 800° C., or 500 to 700° C., etc. For example, the processing temperature may be 600° C.

FIG. 9 is a schematic diagram illustrating an exemplary structure of a first spacer material layer of the semiconductor device structure according to some embodiments in the present disclosure. As shown in FIG. 9, after operation B2 is performed, a second spacer material layer 310 is formed. The second spacer material layer 310 may cover the first spacer material layer 309. In some embodiments, the second spacer material layer 310 may be formed by chemical vapor deposition (CVD), plasma enhanced chemical vapor deposition (PECVD) (not limited to a single or batch reaction chamber), Physical Vapor Deposition (PVD, e.g., evaporation deposition, electrodeposition, sputter deposition), atomic layer deposition (ALD) (not limited to a single or batch reaction chamber), etc. During the formation of the second spacer material layer 310, the processing gas may be methansilane ($SiH_4$), four silicon chloride ($SiCl_4$), four acetyl silicon (TEOS), amino silane (LTO-520), double (two ethyl amide) silane (N-Zero), double (tert butyl amino) silane (BTBAS), hexachlorhexane (HCDS), 3DMAS, oxygen ($O_2$), etc. The processing pressure may be in a range from 0.1 to 100 torr, or 10 to 60 torr, etc. For example, the processing pressure may be 30 torr. The processing temperature may be 20 to 600° C., or 80-400° C., etc. For example, the processing temperature may be 150° C.

FIG. 10 is a schematic diagram illustrating an exemplary structure of a spacer structure of the semiconductor device structure according to some embodiments in the present disclosure. As shown in FIG. 10, after operation B3 is performed, a spacer structure 311 is formed. An etching operation and a planarization operation may be performed on the first spacer material layer 309 and the second spacer material layer 310 to form a first spacer layer 312 and a second spacer layer 313 of the spacer structure 311. At least one portion of the first spacer material layer 309 and the second spacer material layer 310 may be removed using the etching operation to expose at least one portion of the substrate 300. The gate structure 305 may be exposed using the planarization operation. Further, an upper surface of the first spacer layer 312, an upper surface of the second spacer layer 313, and an upper surface of the gate structure 305 may be at the same level.

The first spacer layer may have be in L-shape. Further, the first spacer layer may include a vertical portion 3121 and a horizontal portion 3122. The vertical portion 3121 of the first spacer layer may be attached to and cover the side wall of the gate structure 311. An end of the vertical portion 3121 may be attached to the substrate 300. The horizontal portion 3122 may be attached to and cover the at least one portion of the substrate 300 around the gate structure. The horizontal portion 3122 may be connected with the end of the vertical portion 3121. A side surface of the horizontal portion 3122 may form one portion of the side wall of the first spacer layer 312. A ratio of the thickness denoted by L1 of the second spacer layer 313 to the width of the gate structure 305 in the horizontal direction may be in a range from 40% to 100%.

FIGS. 11, 12, and 13 are schematic diagram illustrating an exemplary structure of an intermediate spacer structure of the semiconductor device structure based on process 200 according to some embodiments in the present disclosure.

FIG. 11 is a schematic diagram illustrating an exemplary structure of an intermediate spacer structure of the semiconductor device structure according to some embodiments in the present disclosure. According to the embodiment shown in FIG. 11, after operations 210-250 are performed, the semiconductor device structure includes the substrate 300, the gate structure 305, and a first intermediate spacer structure 411. The first intermediate spacer structure 411 may include a first intermediate spacer 412, and a second intermediate spacer 413. The first intermediate spacer structure 411 may cover the gate structure 305.

FIG. 12 is a schematic diagram illustrating another exemplary structure of an intermediate spacer structure of the semiconductor device structure according to some embodiments in the present disclosure. According to the embodiment shown in FIG. 12, after operations 210-250 are performed, the semiconductor device structure includes the substrate 300, the gate structure 305, and a second intermediate spacer structure 511. The second intermediate spacer structure 511 may be formed by performing a planarization operation on the first intermediate spacer structure 411. The second intermediate spacer structure 511 may be different from the first intermediate spacer structure 411 (as shown in FIG. 11). An upper surface of the first intermediate spacer 512 is exposed.

FIG. 13 is a schematic diagram illustrating another exemplary structure of a contacting conductive layer of the semiconductor device structure according to some embodiments in the present disclosure. According to the embodiment shown in FIG. 13, after operation 260 is performed, a contacting conductive layer 3151 is formed on the second intermediate spacer structure. In some embodiments, the contacting conductive layer 3151 may be formed using Atomic Layer Deposition (ALD), Chemical Vapor Deposition (CVD), Rapid Thermal Oxidation (RTO), or other technology.

FIG. 14 is a schematic diagram illustrating an exemplary structure of a semiconductor device structure 1400 according to some embodiments in the present disclosure. The semiconductor device structure 1400 may include a substrate 300, a gate structure 305, a spacer structure 311, and a contacting conductive structure 315. After performing a planarization operation on the structure as shown in FIG. 13, the second gate insulating layer 308 may be exposed and the semiconductor device structure 1400 may be formed. An upper surface of the first spacer material layer 312, an upper surface of the second spacer material layer 313, an upper surface of the contacting conductive layer 315, and an upper surface of the second gate insulating layer 308 may be at the same level.

The substrate 300 may be a semiconductor silicon-based substrate, such as a silicon (Si) substrate, a silicon-on-insulator (SOI) substrate, a monocrystalline silicon substrate, a polycrystalline silicon substrate, a non-crystalline amorphous silicon, etc. In some embodiments, the substrate 300 may be a gallium-based substrate, such as a gallium (Ge) substrate, a gallium-on-insulator substrate, etc. In some embodiments, the substrate 300 may be a compound semiconductor substrate, such as a Silicon-Germanium (SiGe) substrate, a Gallium-Arsenic (GaAs), a Gallium-Nitrogen (GaN) substrate, a Zinc-Antimony (InSb) substrate, Zinc-Arsenic (InAs) substrate, or the like. In some embodiments, the substrate 300 may be made of any doped silicon-containing material, e.g., intrinsic silicon, P-type silicon, N-type silicon, etc. It should be appreciated that the substrate described above are for illustration purpose. The present disclosure is not intended to limiting.

The gate structure 305 includes a first gate insulating layer 306, a gate conductive layer 307, and a second gate insulating layer 308.

The first gate insulating layer 306 may be formed on the substrate 300. The first gate insulating layer 306 may be made of a first insulating material, such as silicon oxide, silicon nitride, etc. The thickness of the first gate insulating layer 306 may be in a range from 1 to 10 nm, or 2 to 6 nm, etc. For example, the thickness of the first gate insulating layer 306 may be 4 nm.

The gate conductive layer 307 may be formed on the first gate insulating layer 306. In some embodiments, the gate conductive layer 307 may be made of a conductive material, such as polysilicon, amorphous silicon, microcrystalline silicon, metals such as tungsten, or the like, or a combination thereof. In some embodiments, the gate conductive layer 307 may be formed by doping polysilicon and tungsten. The thickness of the gate conductive layer 307 may be in a range from 20 to 80 nm, or 30 to 60 nm, etc. For example, the thickness of the gate conductive layer 307 may be 50 nm.

The second gate insulating layer 308 may be formed on the gate conductive layer 307. In some embodiments, the second gate insulating layer 308 may be made of a second insulating material, such as silicon nitride, silicon oxide, etc. The first insulating material may be same as or different from the second insulating material. For example, the second insulating material may be silicon nitride. The first insulating material may be silicon oxide. The thickness of the second gate insulating layer 308 may be in a range from 90 to 250 nm, or 100 to 150 nm, etc. For example, the thickness of the second gate insulating layer 308 may be 120 nm.

The spacer structure 311 may be attached to and cover a side wall of the gate structure 305 and at least one portion of the substrate 300 around the gate structure 305. The thickness of the spacer structure 311 may be in a range from 20 to 85 nm, or 25 to 80 nm, etc. As used herein, the thickness of the spacer structure 311 refers to a distance between the side wall of the gate structure 305 and the side wall of the spacer structure 311 that being attached to the contacting conductive structure 315. In some embodiments, the thickness of the spacer structure 311 may be 58 nm.

The spacer structure 311 may include a first spacer layer 312 and a second spacer layer 313. The first spacer layer 312 may cover the side wall of the gate structure 305. The first spacer layer 312 may be made of an insulating material having a first dielectric constant, such as silicon oxide ($SiO_2$), silicon nitride ($Si_3N_4$), etc. The thickness of the first spacer layer 312 (i.e., the thickness of a vertical portion of the first spacer layer) may be in a range from 2 to 15 nm, or 5 to 10 nm, etc. For example, the thickness of the first spacer layer may be 8 nm.

The first spacer layer 311 include a vertical portion and a horizontal portion. The vertical portion of the first spacer layer 311 may be attached to and cover the side wall of the gate structure 305. An end of the vertical portion near the substrate 300 may be attached to the substrate 300. The horizontal portion may be attached to and cover the at least one portion of the substrate 300 around the gate structure 305. The horizontal portion may be connected with the end of the vertical portion. A side surface of the horizontal portion may form one portion of the side wall of the first spacer layer 312. In some embodiments, the first spacer layer 312 may only include the vertical portion. The first spacer layer 312 and the second spacer layer 313 may be alternately formed on the substrate.

The second spacer layer 313 may be made of an insulating material having a second dielectric constant, such as silicon oxide ($SiO_2$), silicon nitride ($Si_3N_4$), etc. In some embodiments, the second dielectric constant may be lower than the first dielectric constant. For example, the first spacer layer 312 may be made of silicon nitride ($Si_3N_4$), and the second spacer layer 313 may be made of silicon oxide ($SiO_2$). The thickness of the second spacer layer 313 may be greater than that of the first spacer layer 312. For example, the thickness of the second spacer layer 313 may be greater than two times of the thickness of the first spacer layer 312. As another example, the thickness of the second spacer layer 313 may be three times of the thickness of the first spacer layer 312. In some embodiments, a ratio of the thickness of the second spacer layer 313 to the width of the gate structure 305 in the horizontal direction may be in a range from 40% to 100%. In some embodiments, the thickness of the second spacer layer 313 may be in a range from 20 to 70 nm, or 40 to 60 nm, etc. For example, the thickness of the second spacer layer 313 may be 50 nm. In some embodiments, a ratio of an area of the side surface of the second spacer layer 313 to a total area of the side wall of the spacer structure 311 may be in a range from 78% to 98%, or 80% to 90%, etc. For example, the ratio of an area of the side surface of the second spacer layer 313 to a total area of the side wall of the spacer structure 311 may be 80%.

The second spacer layer 313 may cover the side surface of the first spacer layer 312 that is defined by the side wall of the vertical portion and the upper surface of the horizontal portion of the first spacer layer. Further, the second spacer layer 313 may be formed on the horizontal portion of the first spacer layer 312. In some embodiments, the second spacer layer 313 may be located on a portion of the horizontal portion. The side surface of the horizontal portion of the first spacer layer 312 may be aligned to a side surface of the second spacer layer 313. In other words, the width of the horizontal portion of the first spacer layer 312 may be greater than the thickness of the second spacer layer 313. In some embodiments, the second spacer layer 313 may completely cover the upper surface of the horizontal portion. In other words, the width of the horizontal portion of the first spacer layer 312 may be equal to the thickness of the second spacer layer 313. As used herein, the width of the horizontal portion of the first spacer layer 312 may refer to a distance between the side surface of the vertical portion of the first spacer layer 312 attaching to the second spacer layer 313 to the side wall of the conductive structure.

The contacting conductive structure 315 may be attached to the side wall of the spacer structure 311 that is defined by the side surface of the horizontal portion of the first spacer layer 312 and the side surface of the second spacer layer 313. In some embodiments, the contacting conductive structure 315 may completely cover the side wall of the spacer structure 311. The height of the contacting conductive structure 315 may be equal to the height of the spacer structure 311. In other words, the upper surface of the spacer structure 311 and the upper surface of the contacting conductive structure 315 may be at the same level. In some embodiments, the contacting conductive structure 315 may cover one portion of the side wall of the spacer structure 311. The height of the contacting conductive structure 315 may be lower than the height of the spacer structure 311. A ratio of the height of the contacting conductive structure 315 to the height of the spacer structure 311 may be in range from 40% to 90%. The ratio of the height of the contacting conductive structure 315 to the height of the spacer structure 311 may be also referred to as a covering rate for the contacting conductive structure 315 covering the side wall of the spacer structure 311. In some embodiments, the height of the contacting conductive structure 315 may be in a range from 110 to 250 nm, or 150 to 200 nm, etc. The thickness of the contacting conductive structure 315 may be in a range from 50 to 300 nm, or 70 to 90 nm, etc. For example, the thickness of the contacting conductive structure 315 may be 80 nm.

FIG. 15 is a schematic diagram illustrating a structure of a semiconductor device structure 1500 according to some embodiments in the present disclosure. The semiconductor device structure 1500 may include a substrate 300, a gate structure 305, a spacer structure 311, and a contacting conductive structure 315 as described elsewhere in the present disclosure. In some embodiments, structures (e.g., the substrate 300, the gate structure 305, the contacting conductive structure 315) of the semiconductor device structure 1500 may be same as or similar to structures of the semiconductor device structure 1400. For example, the gate structure 305 of the semiconductor device structure 1500 may be same as the gate structure 305 of the semiconductor device structure 1400. In some embodiments, one or more structures (e.g., the spacer structure 311) of the semiconductor device structure 1500 may be different from structures of the semiconductor device structure 1400. For example, the substrate 300 of the semiconductor device structure 1500 may include a gallium (Ge) substrate and the substrate 300 of the semiconductor device structure 1400 may include a silicon (Si) substrate.

As another example, the spacer structure 311 may include more than two spacers (e.g., N spacers). As shown in FIG. 15, the spacer structure 311 may include a first spacer layer 312, a second spacer layer 313, a third spacer 314, and a fourth spacer 316. The first spacer layer 312 may cover a side wall of the gate structure 305. The first spacer layer 312 may have a first dielectric constant. More descriptions for the first spacer layer 312 may be found elsewhere in the present disclosure. The second spacer layer 313 of the semiconductor device structure 1500 may be made of an insulating material having a second dielectric constant smaller the first dielectric constant. The second spacer layer 313 may cover the side surface of the first spacer layer 312. The second spacer layer 313 may have a horizontal portion and a vertical portion. The horizontal portion and the vertical portion of the second spacer layer 313 may cover the horizontal portion and the vertical portion of the first spacer layer 312, respectively. More descriptions for the second spacer layer 313 may be found elsewhere in the present disclosure.

The third spacer 314 may cover the side surface of the second spacer layer 313. The third spacer 314 may be made of an insulating material have a third dielectric constant smaller than the first dielectric constant. The third spacer 314 may have a horizontal portion and a vertical portion. The horizontal portion and the vertical portion of the third spacer 314 may cover the horizontal portion and the vertical portion of the second spacer layer 313, respectively. The fourth spacer 316 may be formed on the horizontal portion of the third spacer 314 and cover the vertical portion and the horizontal portion of the third spacer 314. An end (or side surface) of the horizontal portion of each of the first spacer layer 312, the second spacer layer 313, and the third spacer 314 may be at the same vertical plane as the side surface of the fourth spacer 316. The side wall of the gate structure 305 may be defined by the side surface side surface of the horizontal portion of each of the first spacer layer 312, the second spacer layer 313, and the third spacer 314 and the side surface of the fourth spacer 316.

According to the present disclosure, the spacer structure 315 may be a stacked structure including N spacers sequentially stacked on the substrate 300. N may be an integer greater than or equal to value 2. Each of the front (N−1) spacers (e.g., the first spacer layer 312, the second spacer layer 313, and the third spacer 314) may include a vertical portion and a horizontal portion. The vertical portions and the horizontal portions of two adjacent spacers of the front (N−1) spacers may be connected respectively. In some embodiments, an end (or a side surface) of the horizontal portion of each of the front (N−1) spacers may be located in the same vertical plane as the side surface of the Nth spacer. The side wall of the gate structure 305 may be defined by the side surface of the horizontal portion of each of the front (N−1) spacers and the side surface of the Nth spacer. Each of the intermediate spacers between the first spacer layer and the Nth spacer may have a dielectric constant that may be smaller than the first dielectric constant of the first spacer layer. For example, if the first spacer layer is silicon nitride and the Nth spacer is silicon oxide. If N is value 3, the spacer structure may be $Si_3N_4$—$SiO_2$—$Si_3N_4$. If N is value 4, the spacer structure may be $Si_3N_4$-$SaO_2$—$Si_3N_4$-$SaO_2$ or $Si_3N_4$-$SaO_2$-$SaO_2$—$Si_3N_4$.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with some embodiments is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof.

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may further be implemented as a software-only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

The invention claimed is:

1. A method for semiconductor device fabrication, comprising:
   providing a substrate;
   forming a gate structure on the substrate;
   forming a spacer structure on the substrate covering a side wall of the gate structure and a portion of the substrate around the gate structure, the spacer structure including a first spacer layer having a first dielectric constant and a second spacer layer having a second dielectric constant lower than the first dielectric constant, the first spacer layer attached to the side wall of the gate structure, and the second spacer layer attached on a side wall of the first spacer layer, wherein the first spacer layer is made of silicon nitride, the first spacer layer includes a vertical portion and a horizontal portion, the vertical portion attached to the side wall of the gate structure, the horizontal portion attached to the substrate and connected to an end of the vertical portion close to the substrate, an end of the horizontal portion away from the vertical portion being a side surface of the first spacer layer, and the second spacer layer is formed on the horizontal portion of the first spacer layer and attached to the vertical portion of the first spacer layer, a thickness of the second spacer layer is greater than two times of a thickness of the vertical portion of the first spacer layer, a ratio of the thickness of the second spacer layer to a width of the gate structure in a horizontal direction is in a range from 40% to 100%; and
   forming a contacting conductive structure on the substrate and attached to a side wall of the spacer structure, wherein the side wall of the spacer structure includes the side surface of the first spacer layer and a side surface of the second spacer layer, a ratio of an area of the side surface of the second spacer layer to a total area of the side wall of the spacer structure is in a range from 78% to 98%, and wherein a upper surface of the first spacer layer, a upper surface of the second spacer layer, a upper surface of the contacting conductive structure are level with a upper surface of the gate structure,
   wherein forming a spacer structure on the substrate includes:
      forming a first spacer material layer covering the upper surface and a side surface of the gate structure and at least one portion of the substrate around the gate structure;
      forming a second spacer material layer on surfaces of the first spacer material layer; and
      performing an etching operation and a first planarization operation to expose the first spacer material layer attached to the gate structure, to cause a upper surface of the first spacer material layer level with a upper surface of the second spacer material layer, to form a vertical portion and a horizontal portion of the first spacer material layer, and to cause the second spacer material layer to form the second spacer layer with a pre-set width, wherein the first planarization operation is performed before the contacting conductive structure is formed,
   and wherein forming a contacting conductive structure on the substrate and attached to a side wall of the spacer structure comprises:
      forming a contacting conductive material layer covering the upper surface of the first spacer material layer and the upper surface of the second spacer material layer; and
      performing a second planarization operation to expose the gate structure, and to cause the upper surface of the first spacer material layer, the upper surface of the second spacer material layer, the upper surface of the contacting conductive material layer to be level with the upper surface of the gate structure, and to cause the contacting conductive material layer to form two or more contacting conductive layers.

2. The method of claim 1, wherein forming a gate structure on the substrate includes:
   forming a first gate insulating material layer on the substrate;
   forming a gate conductive material layer on the first gate insulating material layer;
   forming a second gate insulating material layer on the gate conductive material layer; and
   performing an etching operation to form the gate structure, wherein the gate structure comprises:

the first gate insulating layer formed on the substrate;
the gate conductive layer formed on the first gate insulating layer; and
the second gate insulating layer formed on the gate conductive layer.

3. The method of claim 1, further comprising: before performing an etch operation and a first planarization operation to expose the first spacer material layer,
forming one or more spacer material layers alternately stacking over each other, wherein each of the one or more spacer material layers is made of a material of one of the first spacer material layer and the second spacer material layer, and different from a material of a neighboring spacer material layer,
and wherein when performing an etching operation and the first planarization operation to expose the first spacer material layer, the first spacer material layer attached to the gate structure is exposed, and wherein upper surfaces of each of the one or more spacer material layers are level with an upper surface of a second gate insulating layer.

\* \* \* \* \*

UNITED STATES PATENT AND TRADEMARK OFFICE
CERTIFICATE OF CORRECTION

PATENT NO. : 11,063,136 B2
APPLICATION NO. : 16/730821
DATED : July 13, 2021
INVENTOR(S) : Rongfu Zhu Page 1 of 1

It is certified that error appears in the above-identified patent and that said Letters Patent is hereby corrected as shown below:

On the Title Page

(30) Foreign Application Priority Data, insert:
Jun. 30, 2017 (CN) .................. 201710520597.6

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*